(12) United States Patent
Kim et al.

(10) Patent No.: US 7,449,914 B2
(45) Date of Patent: Nov. 11, 2008

(54) SEMICONDUCTOR MEMORY DEVICE

(75) Inventors: Yong-Ki Kim, Kyoungki-do (KR);
Kyung-Hoon Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 45 days.

(21) Appl. No.: 11/475,679

(22) Filed: Jun. 26, 2006

(65) Prior Publication Data

US 2007/0070763 A1   Mar. 29, 2007

(30) Foreign Application Priority Data

Sep. 29, 2005   (KR) .................. 10-2005-0090935
Dec. 29, 2005   (KR) .................. 10-2005-0134194

(51) Int. Cl.
*H03K 17/16* (2006.01)
*H03K 19/003* (2006.01)

(52) U.S. Cl. .................. 326/30; 326/32; 326/34

(58) Field of Classification Search ............ 326/26–27, 326/30
See application file for complete search history.

(56) References Cited

U.S. PATENT DOCUMENTS

| | | | |
|---|---|---|---|
| 6,777,976 B2* | 8/2004 | Kuge | ........................ 326/30 |
| 7,019,555 B2 | 3/2006 | Lee | |
| 7,138,823 B2* | 11/2006 | Janzen et al. | ................. 326/30 |
| 2005/0225353 A1 | 10/2005 | Kwon | |
| 2005/0231230 A1 | 10/2005 | Na et al. | |

FOREIGN PATENT DOCUMENTS

| | | |
|---|---|---|
| JP | 2004-310981 | 11/2004 |
| JP | 2005-228458 | 8/2005 |
| KR | 2003-0090955 | 12/2003 |

* cited by examiner

*Primary Examiner*—Anh Q Tran
(74) *Attorney, Agent, or Firm*—Blakely, Sokoloff, Taylor & Zafman (57) ABSTRACT

A semiconductor memory device includes a code channel for outputting a plurality of code signals based on a code control signal inputted from an external source; a termination resistor decoder for decoding a chip selection signal, an on die termination (ODT) control signal and the plurality of code signals and outputting a plurality of selection signals based on decoded signals; and an ODT block for providing an output data pad with impedance of a termination resistor which is selected in response to the plurality of selection signals.

27 Claims, 8 Drawing Sheets

SEMICONDUCTOR MEMORY DEVICE

FIELD OF THE INVENTION

The present invention relates to a semiconductor memory device; and, more particularly, to a semiconductor memory device including a multiple on die termination (ODT) resistors for optimizing channel impedance.

DESCRIPTION OF RELATED ARTS

Generally, a semiconductor memory device includes a memory array having a matrix composed of a row address and a column address. The semiconductor memory device further includes a DRAM interface block, e.g., a logical circuit, a command interface, an address interface and a data interface, for writing data to the memory array and reading data from the memory array.

The semiconductor memory device is applicable to devices such as desktop and laptop computers which require a storage unit. Recently, semiconductor memory devices have enlarged their application to digital convergence and digital home appliance devices.

The semiconductor memory device is classified according to a unit cell or a storage cell constituting the memory array. A dynamic random access (DRAM) memory is one of the most commercially famous semiconductor memory devices.

Figure 1:
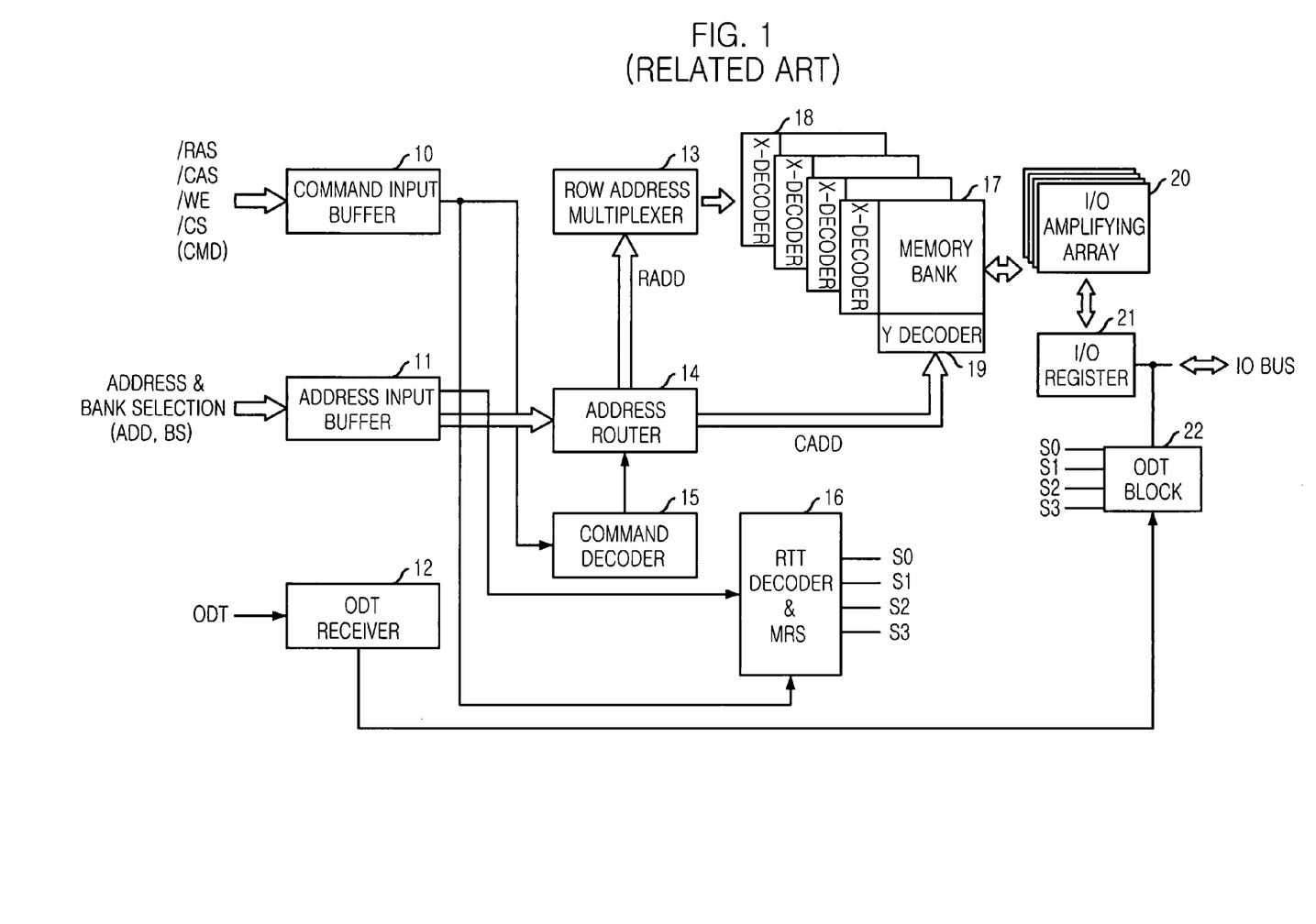
FIG. 1 is a block diagram showing a DRAM device of the related arts.

FIG. 1 is a block diagram showing a DRAM device of the related arts.

As shown, the DRAM device includes a command input buffer 10, an address input buffer 11, an ODT receiver 12, a row address multiplexer 13, an address router 14, a command decoder 15, a termination resistor (RTT) decoder & mode register set (MRS) 16, a memory bank 17, an X-decoder 18, a Y decoder 19, an input/output (I/O) amplifying array 20, an input/output (I/O) register 21 and an ODT block 22.

The above DRAM device is functionally classified into a DRAM core array including a memory cell array, a peripheral logic block for performing a data access and offering control signals, and a DRAM interface block for transferring the data, an address and the control signals.

Herein, the DRAM core array can write and read data to/from a predetermined location in response to a random address. The DRAM interface block such as the command input buffer 10 and the address input buffer 11 provides information of a reading and writing timing and a data location. In addition, a data input/output (I/O) buffer operating as one of the DRAM interface blocks provides a data transfer passageway when writing the data to a selected memory cell array or reading the data from the selected memory cell array.

Meanwhile, the DRAM device includes the DRAM core array including the memory cell array. Each memory cell includes a transistor and a capacitor. Accordingly, the DRAM device performs periodically a refresh operation because data is destroyed a predetermined time after writing data. In spite of the above weakness, the DRAM device is broadly used as a semiconductor memory device because the DRAM device can be implemented with a relative small size and low cost.

Further, the DRAM device includes a plurality of logic circuits such as various decoders, counters and combinations thereof. Though the memory cell for storing a data in the DRAM device is the most important element, the above logic circuits are also required for performing the storing operation. Further, the plural logic circuits are combined and implemented according to a function required by the DRAM device.

In addition, the DRAM interface block is operated as the data transfer passageway which transfers a command, an address and a data, so as to write the data to the DRAM device or read the data from the DRAM device.

Generally, the DRAM interface block includes an output buffer such as a driver and a transceiver, and an input buffer such as a bus and receiver. In the DRAM interface block, a transfer rate between data or between other signals is represented as an operating frequency; and a capacity of the transferred data is represented as a bandwidth by converting the capacity into a time unit. In the DRAM interface block, it is important to rapidly transfer the data in safety.

Figure 2:
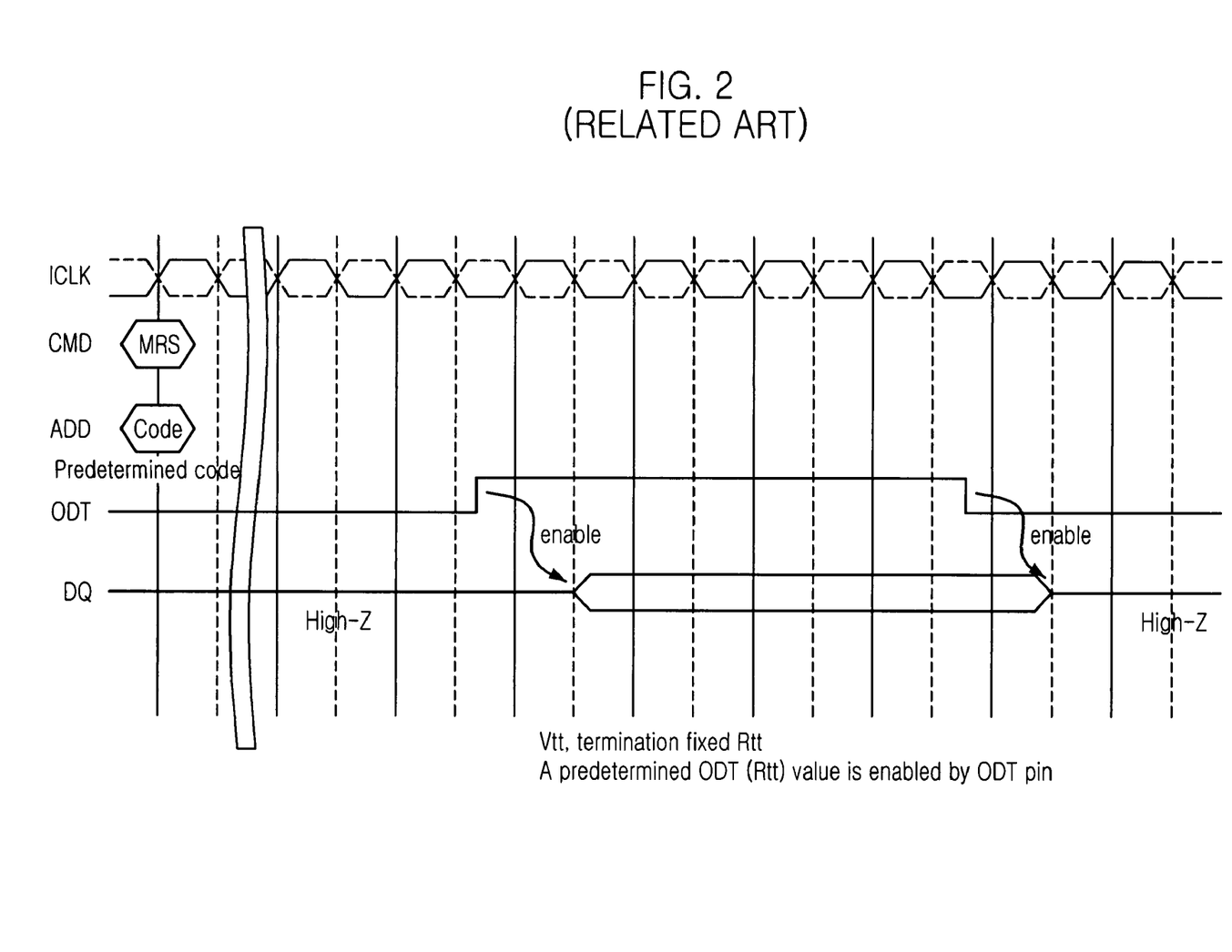
FIG. 2 is a timing diagram describing an operation of a semiconductor memory device of the related arts.

FIG. 2 is a timing diagram describing an operation of a semiconductor memory device of the related arts.

As shown, the semiconductor memory device of the related arts enables an ODT control signal ODT based on a predetermined code, e.g., an address signal ADD, set by a mode register set (MRS). Accordingly, a fixed impedance of an ODT resistor is set via an output data pad DQ while the ODT control signal ODT is enabled.

Meanwhile, the semiconductor memory device includes only one ODT resistor provided by an ODT device during transferring a data. Accordingly, the fixed impedance of the ODT resistor is provided regardless of the number of memory allocated to a channel. As a result, it is difficult to optimize an efficiency of a transferred signal.

SUMMARY OF THE INVENTION

It is, therefore, an object of the present invention to provide an on die termination (ODT) control device including multiple on die termination (ODT) resistors for optimizing channel impedance by allocating an independent ODT resistor to each of a plurality of memory banks during read or write operation.

In accordance with an aspect of the present invention, there is provided a semiconductor memory device including: a code channel for outputting a plurality of code signals based on a code control signal inputted from an external source; a termination resistor decoder for decoding a chip selection signal, an on die termination (ODT) control signal and the plurality of code signals and outputting a plurality of selection signals based on decoded signals; and an ODT block for providing an output data pad with impedance of a termination resistor which is selected in response to the plurality of selection signals.

In accordance with an aspect of the present invention, there is provided a semiconductor memory device including: a plurality of memory banks for controlling a read/write operation of data in memory cells; a code channel for outputting a plurality of code signals based on a code control signal inputted from an external source; a command input buffer for buffering a chip selection signal and outputting a buffered signal; an on-die termination (ODT) receiver for receiving an ODT control signal and outputting a received signal; a termination resistor decoder for decoding the buffered signal from the command input buffer, the received signal from the ODT receiver and the plurality of code signals and outputting a plurality of selection signals based on decoded signals; and an ODT block for providing an output data pad with impedance of a termination resistor which is selected in response to the plurality of selection signals.

In accordance with an aspect of the present invention, there is provided a semiconductor memory device, including: a plurality of memory modules connected to a data channel; and a plurality of ranks connected to the plurality of memory modules and having a logical memory operation unit or a physical memory operation unit, wherein the plurality of ranks include a termination resistor control unit for allocating a different impedance of a termination resistor to the plurality of ranks during read and write operations of the plurality of memory modules, according to a combination of a chip selection signal, an on die termination (ODT) control signal and a code control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 3:
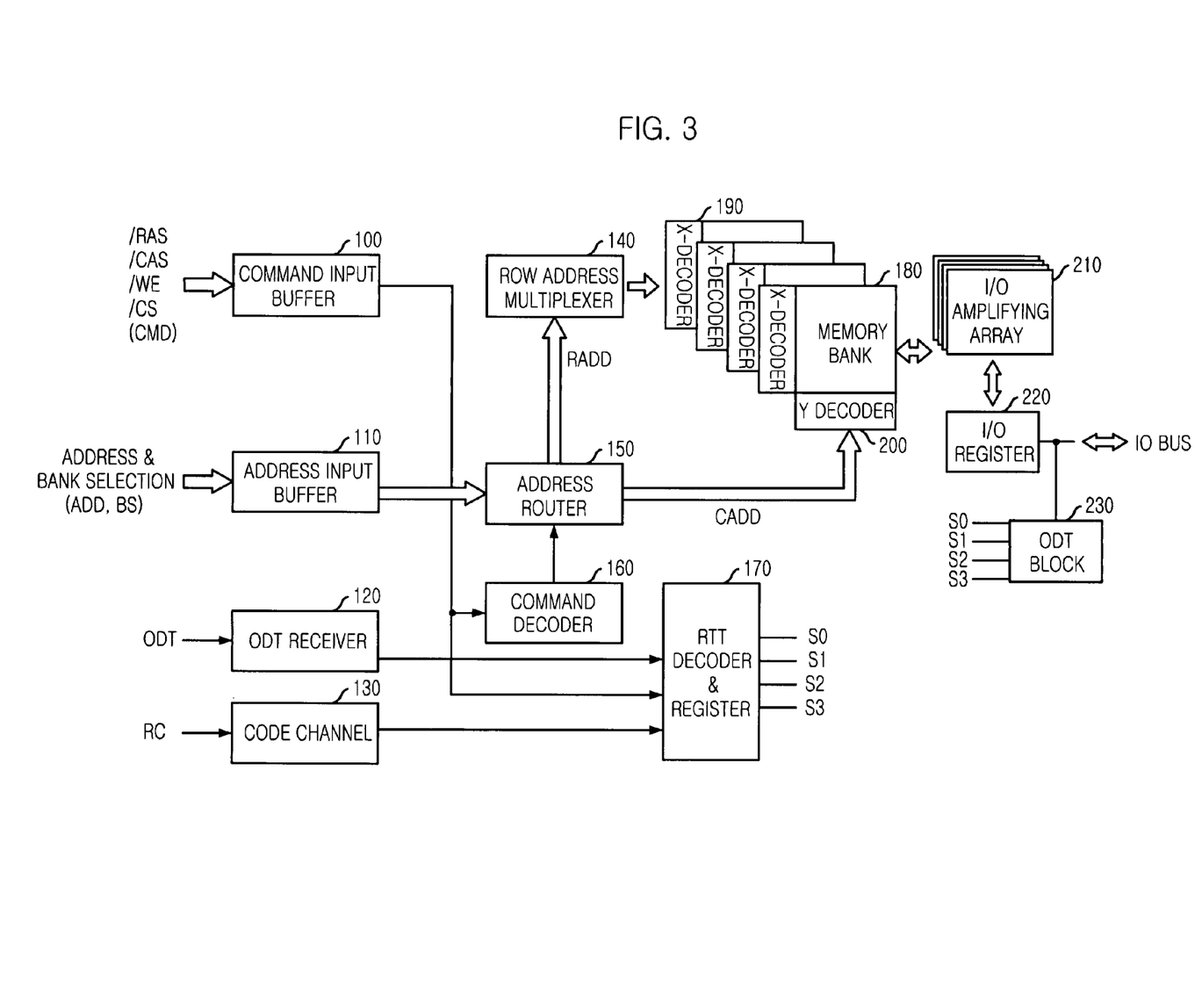
FIG. 3 is a block diagram showing a semiconductor memory device in accordance with an embodiment of the present invention.

FIG. 3 is a block diagram showing a semiconductor memory device in accordance with an embodiment of the present invention.

As shown, the semiconductor memory device in accordance with the embodiment of the present invention includes a command input buffer 100, an address input buffer 110, an ODT receiver 120, a code channel 130, a row address multiplexer 140, an address router 150, a command decoder 160, a termination resistor (RTT) decoder & register 170, a memory bank 180, an X-decoder 190, a Y decoder 200, an input/output (I/O) amplifying array 210, an input/output (I/O) register 220 and an ODT block 230.

The command input buffer 100 receives and buffers a command signal CMD such as a row address strobe (RAS) signal/RAS, a column address strobe (CAS) signal/CAS, a write enable signal/WE and a chip selection signal/CS, to output the buffered signal to the command decoder 160 and the RTT decoder & register 170. Herein, '/' of the RAS signal/RAS, the CAS signal/CAS, the write enable signal/WE and the chip selection signal/CS denotes a negative active signal, i.e., being activated with a logic level 'LOW'.

The address input buffer 110 receives and buffers an address signal ADD and a bank selection signal BS to output the buffered signal to the address router 150.

The ODT receiver 120 receives an ODT control signal ODT to output the received signal to the RTT decoder & register 170.

The code channel 130 receives a code control signal RC to output the received signal to the RTT decoder & register 170. Herein, the code control signal RC is for selecting one of a plurality of ODT resistors.

The address router 150 receives outputs outputted from the address input buffer 110 and the command decoder 160 to output a column address CADD to the Y-decoder 200, and a row address RADD to the row address multiplexer 140.

The row address multiplexer 140 receives and multiplexes the row address RADD to output the multiplexed signal to the X-decoder 190.

The command decoder 160 decodes an output of the command input buffer 100 to output the decoded signal to the address router 150.

The RTT decoder & register 170 receives and decodes outputs of the command input buffer 100, the ODT receiver 120 and the code channel 130 to output the decoded signals as a first to a fourth selection signals S0 to S3 to the ODT block 230. Herein, a register provided in the RTT decoder & register 170 saves the first to the fourth selection signals S0 to S3 or a decoding signal outputted from the RTT decoder for selecting a desired ODT resistor.

The I/O amplifying array 210 amplifies a data outputted from a corresponding memory bank 180 to output the amplified signal to the I/O register 220.

The ODT block 230 controls an impedance of the ODT resistor to output the controlled impedance to an input/output (I/O) bus based on the first to the fourth selection signals S0 to S3 outputted from the RTT decoder & register 170.

Figure 4:
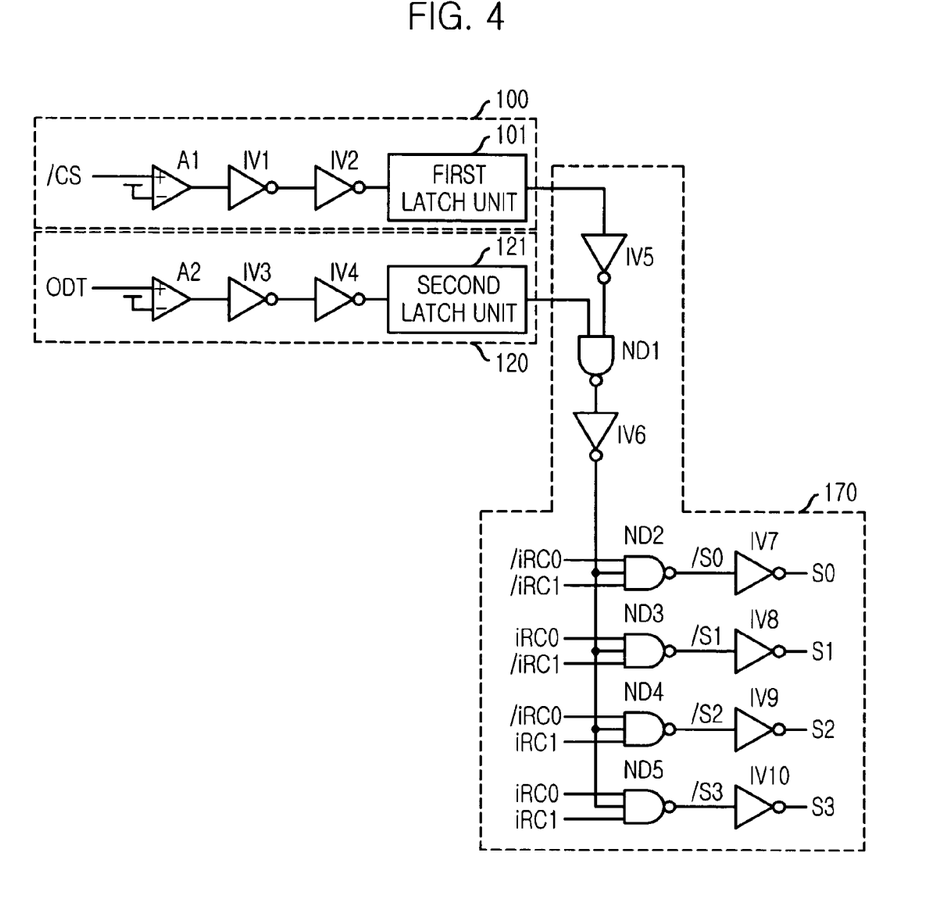
FIG. 4 is a detailed circuit diagram depicting a command input buffer, an on die termination (ODT) receiver and a termination resistor (RTT) decoder & mode register set (MRS) shown in FIG. 3.

FIG. 4 is a detailed circuit diagram depicting the command input buffer 100, the ODT receiver 120 and the RTT decoder & register 170 shown in FIG. 3.

As shown, the command input buffer 100 includes a first amplifying unit A1, first and second inverters IV1 and IV2, and a first latch unit 101. Herein, the first amplifying unit A1 compares a source voltage with the chip selection signal/CS and amplifies the compared result. The first and second inverters IV1 and IV2 delay an output of the first amplifying unit A1 without inverting. The first latch unit 101 latches an output of the second inverter IV2 by a predetermined time to output the latched signal to the RTT decoder & register 170.

The ODT receiver 120 includes a second amplifying unit A2, third and fourth inverters IV3 and IV4, and a second latch unit 121. Herein, the second amplifying unit A2 compares the source voltage with the ODT control signal ODT and amplifies the compared result. The third and fourth inverters IV3 and IV4 delay an output of the second amplifying unit A2 without inverting. The second latch unit 121 latches an output of the fourth inverter IV4 by a predetermined time to output the latched signal to the RTT decoder & register 170.

The RTT decoder & register 170 includes a plurality of inverters IV5 to IV10, and a plurality of NAND gates ND1 to ND5. Herein, a fifth inverter IV5 inverts an output of the first latch unit 101. A first NAND gate ND1 performs a NAND operation of outputs of the fifth inverter IV5 and the second latch unit 121. A sixth inverter IV6 inverts an output of the first NAND gate ND1.

A second NAND gate ND2 performs a NAND operation of first and second code bar signals/iRC0 and/iRC1 and an output of the sixth inverter IV6 to output a first selection bar signal IS0. A third NAND gate ND3 performs a NAND operation of a first code signal iRC0, the second code bar signal/iRC1 and the output of the sixth inverter IV6 to output a second selection bar signal/S1. A fourth NAND gate ND4 performs a NAND operation of the first code bar signal/iRC0, a second code signal iRC1 and the output of the sixth inverter IV6 to output a third selection bar signal/S2. A fifth NAND gate ND5 performs a NAND operation of the first and second code signals iRC0 and/iRC1 and the output of the sixth inverter IV6 to output a fourth selection bar signal/S3.

In addition, a seventh inverter IV7 inverts the first selection bar signal/S0 to output the first selection signal S0. An eighth inverter IV8 inverts the second selection bar signal IS1 to output the second selection signal S1. A ninth inverter IV9 inverts the third selection bar signal/S2 to output the third selection signal S2. A tenth inverter IV10 inverts the fourth selection bar signal/S3 to output the fourth selection signal S3.

Figure 5:
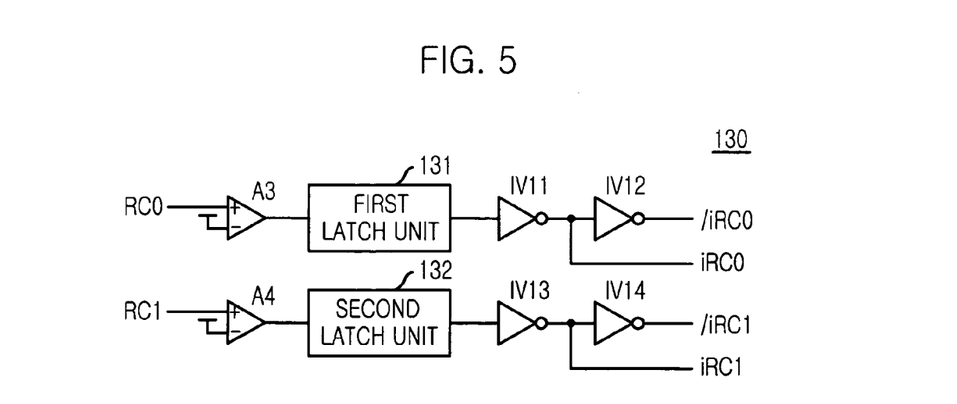
FIG. 5 is a detailed circuit diagram depicting a code channel shown in FIG. 3.

FIG. 5 is a detailed circuit diagram depicting the code channel 130 shown in FIG. 3.

As shown, the code channel 130 includes first and second amplifying units A3 and A4, first and second latch units 131 and 132, and a plurality of inverters IV11 to IV14.

Herein, the first amplifying unit A3 compares the source voltage with a first code control signal RC0 and amplifies the compared result. The first latch unit 131 latches an output of the first amplifying unit A3 by a predetermined time. A first inverter IV11 inverts an output of the first latch unit 131 to output the inverted signal as the first code signal iRC0. A second inverter IV12 inverts the first code signal iRC0 to output the inverted signal as the first code bar signal/iRC0.

In addition, the second amplifying unit A4 compares the source voltage with a second code control signal RC1 and amplifies the compared result. The second latch unit 132 latches an output of the second amplifying unit A4 by a predetermined time. A third inverter IV13 inverts an output of the second latch unit 132 to output the inverted signal as the second code signal iRC1. A fourth inverter IV14 inverts the second code signal iRC1 to output the inverted signal as the second code bar signal/iRC1.

Figure 6:
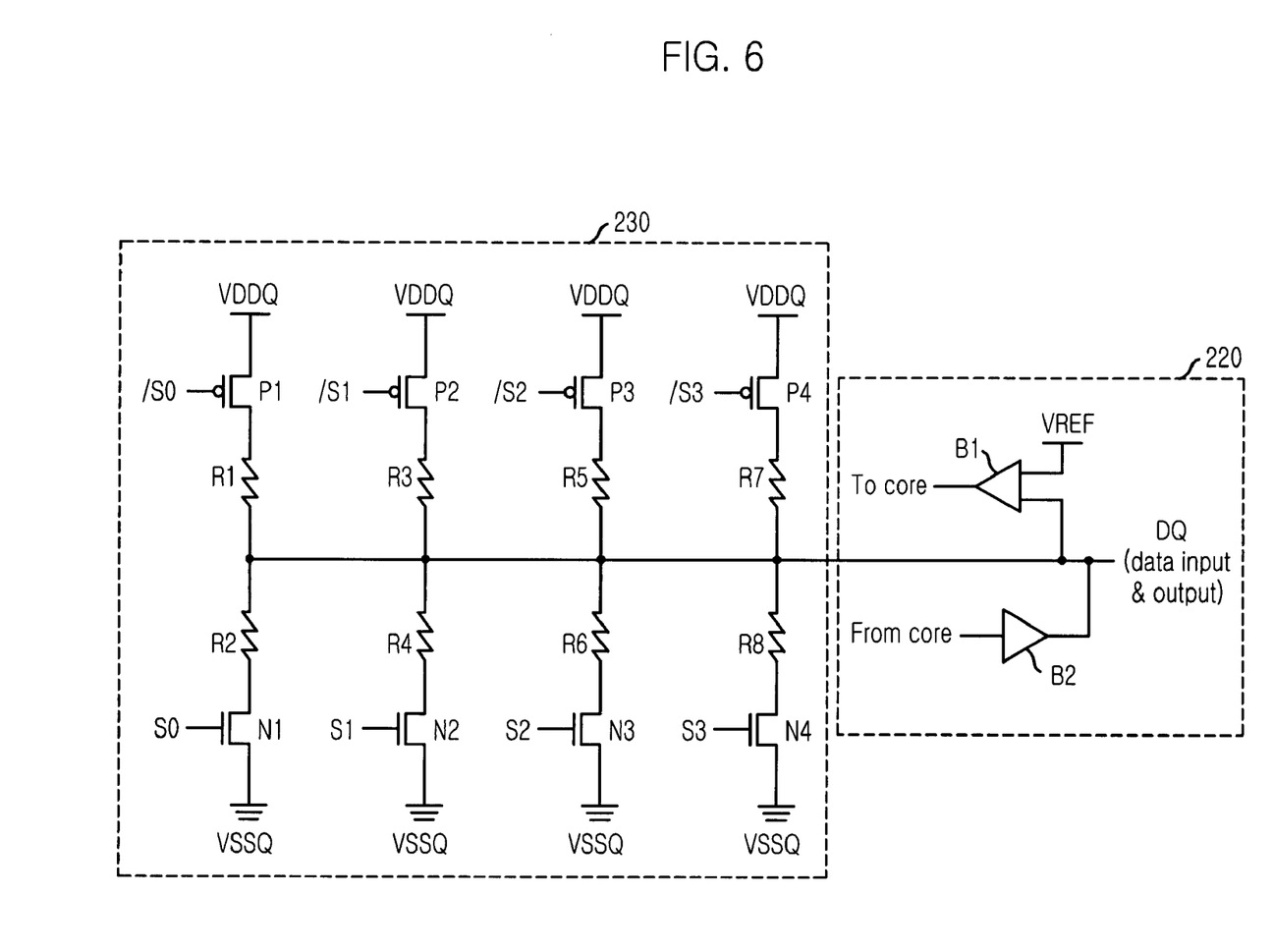
FIG. 6 is a detailed circuit diagram depicting an ODT block and an input/output register shown in FIG. 3.

FIG. 6 is a detailed circuit diagram depicting the ODT block 230 and the I/O register 220 shown in FIG. 3.

As shown, the ODT block 230 includes a plurality of PMOS transistors P1 to P4, a plurality of NMOS transistors N1 to N4, and a plurality of resistors R1 to R8.

Herein, a first PMOS transistor P1, first and second resistors R1 and R2, and a first NMOS transistor N1 are connected in series between a source voltage terminal VDDQ and a ground voltage terminal VSSQ. The first selection bar signal/S0 is applied to a gate of the first PMOS transistor P1, and the first selection signal S0 is applied to a gate of the first NMOS transistor N1.

Likewise, a second PMOS transistor P2, third and fourth resistors R3 and R4, and a second NMOS transistor N2 are connected in series between the source voltage terminal VDDQ and the ground voltage terminal VSSQ. The second selection bar signal/S1 is applied to a gate of the second PMOS transistor P2, and the second selection signal S1 is applied to a gate of the second NMOS transistor N2.

A third PMOS transistor P3, fifth and sixth resistors R5 and R6, and a third NMOS transistor N3 are connected in series between the source voltage terminal VDDQ and the ground voltage terminal VSSQ. The third selection bar signal/S2 is applied to a gate of the third PMOS transistor P3, and the third selection signal S2 is applied to a gate of the third NMOS transistor N3.

A fourth PMOS transistor P4, a seventh and an eighth resistors R7 and R8, and a fourth NMOS transistor N4 are connected in series between the source voltage terminal VDDQ and the ground voltage terminal VSSQ. The fourth selection bar signal/S3 is applied to a gate of the fourth PMOS transistor P4, and the fourth selection signal S3 is applied to a gate of the fourth NMOS transistor N4.

The I/O register 220 includes first and second receivers B1 and B2. Herein, the first receiver B1 receives a signal applied to an output data pad DQ via the I/O bus, on the basis of a reference voltage VREF, to output the received signal to a core, i.e., the I/O amplifying array 210. The second receiver B2 receives and buffers a signal applied from the core to output the buffered signal to the data pad DQ via the I/O bus.

Figure 7:
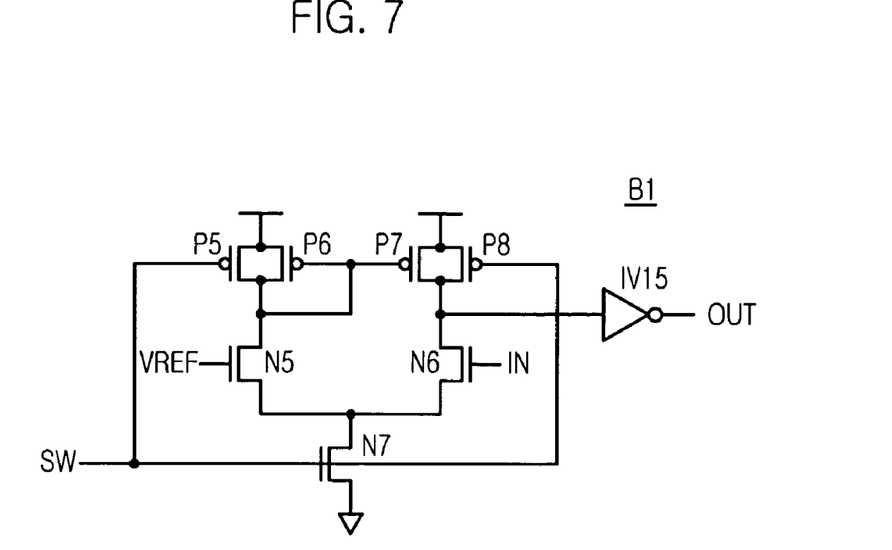
FIG. 7 is a detailed circuit diagram depicting a receiver of the input/output register shown in FIG. 6.

FIG. 7 is a detailed circuit diagram depicting the first receiver B1 of the I/O register shown in FIG. 6.

As shown, the first receiver B1 includes a plurality of PMOS transistors P5 to P8, a plurality of NMOS transistors N5 to N7, and an inverter IV15. Accordingly, the first receiver B1 forms a differential amplifier which compares the reference voltage VREF with an input signal IN based on a switch signal SW.

In detail, sources of a first to a fourth PMOS transistors P5 to P8 are common for receiving the source voltage; each gate of the second and third PMOS transistors P6 and P7 is connected; and each gate of the first and fourth PMOS transistors P5 and P8 receives the switch signal SW.

A gate of a first NMOS transistor N5 receives the reference voltage VREF and a gate of a second NMOS transistor N6 receives the input signal IN. Herein, drains of the first and second PMOS transistors P5 and P6 are connected with a drain of the first NMOS transistor N5; and drains of the third and fourth PMOS transistors P7 and P8 are connected with a drain of the second NMOS transistor N6.

The inverter IV15 inverts a signal applied to the drain of the second NMOS transistor N6 to output the inverted signal as an output signal OUT.

The third NMOS transistor N7 connected between the ground voltage and sources of the first and second NMOS transistors N5 and N6 includes a gate for receiving the switching signal SW.

Figure 8:
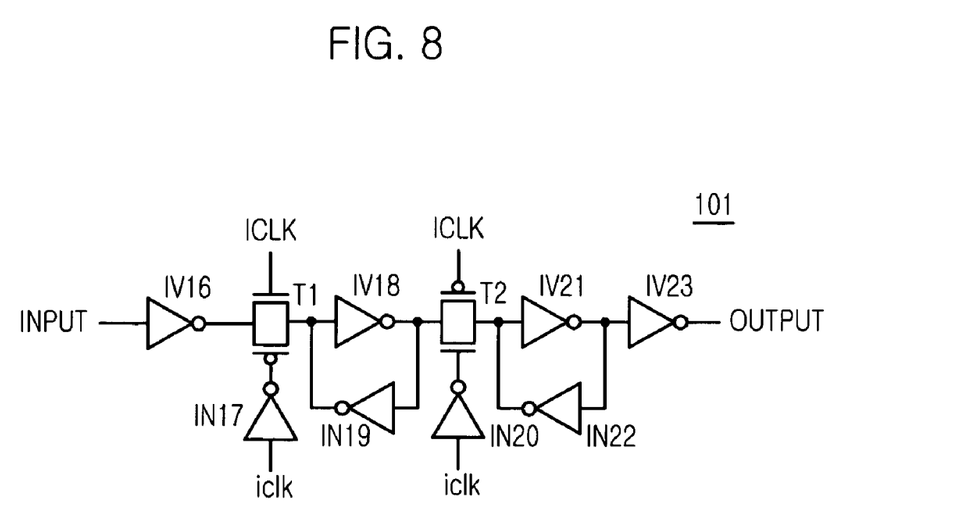
FIG. 8 is a detailed circuit diagram depicting a latch unit shown in FIGS. 4 to 5.

FIG. 8 is a detailed circuit diagram depicting the first latch unit 101 of the command input buffer 100 shown in FIGS. 4 to 5.

Herein, each of the second latch unit 121 of the ODT receiver 120 and the first and second latch units 131 and 132 of the code channel 130 has the same circuit structure with the first latch unit 101 of the command input buffer 100, and thus, the first latch unit 101 will be described as an exemplary structure.

As shown, the first latch unit 101 includes a plurality of inverters IV16 to IV23 and first and second transfer gates T1 and T2. Accordingly, the first latch unit 101 latches an input signal INPUT according to a switching operation of the first and second transfer gates T1 and T2 in response to an internal clock ICLK to output the latched signal as an output signal OUTPUT.

Hereinafter, referring to FIG. 9, an operation for the semiconductor memory device of the present invention will be described.

Figure 9:
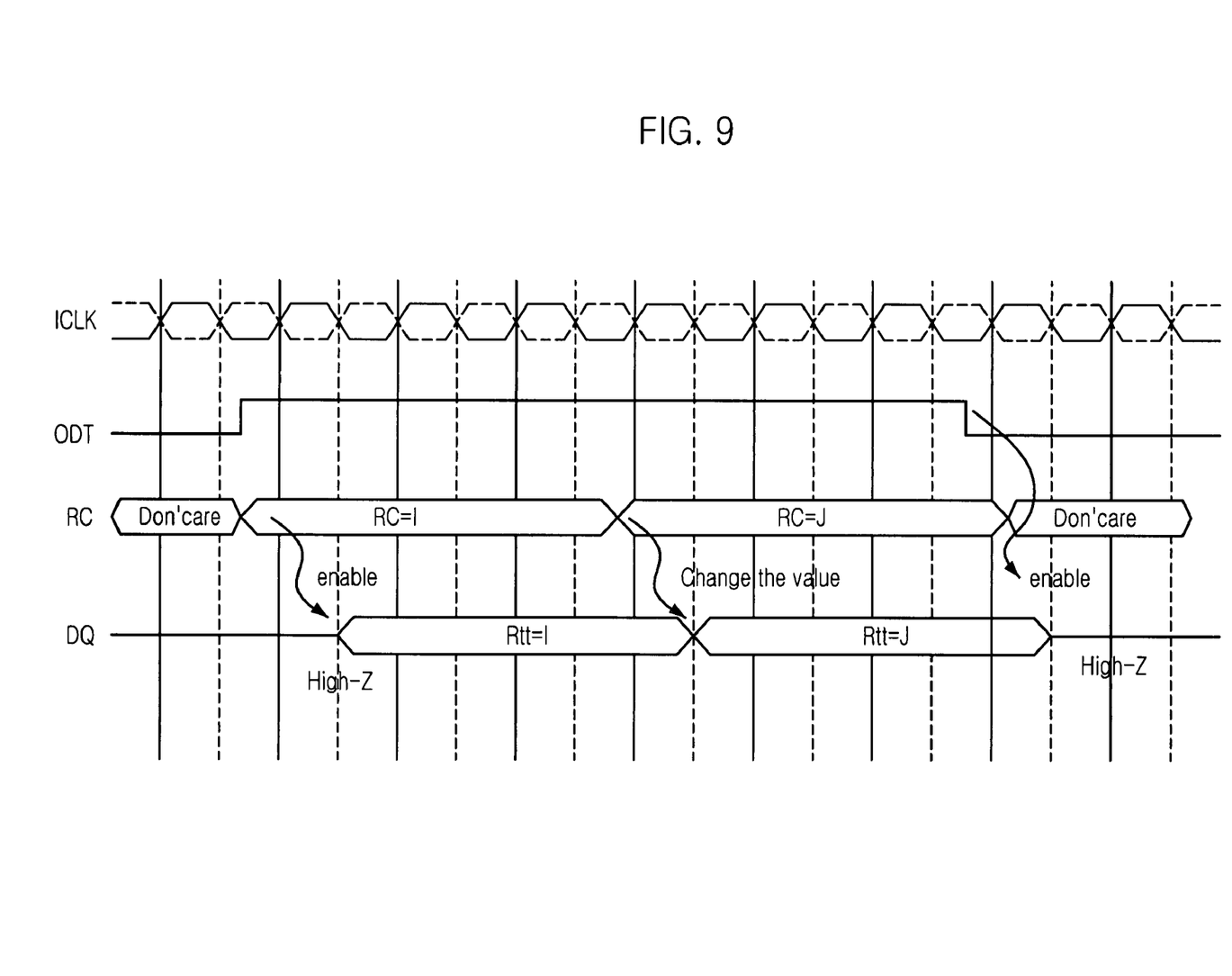
FIG. 9 is a timing diagram describing an operation of the semiconductor memory device shown in FIGS. 3 to 8.

FIG. 9 is a timing diagram describing an operation of the semiconductor memory device shown in FIGS. 3 to 8.

As shown, the RTT decoder & register 170 receives and decodes the outputs of the command input buffer 100, the ODT receiver 120 and the code channel 130 to output the first to the fourth selection signals S0 to S3 for selecting the impedance of the ODT resistor.

The code control signal RC inputted to the code channel 130 may include a single bit, a pair of bits or a plurality of bits; and have a point of a predetermined delay time larger than a half clock when inputting.

In accordance with the preferred embodiment of the present invention, it is assumed that there are the first to fourth selection signals S0 to S3; and thus the code control signal RC has four bits so as to adjust the ODT resistor according to sixteen cases.

Table 1 below shows exemplary impedances of the ODT resistors according to the code control signal RC.

TABLE 1

| code control signal RC | S4 | S3 | S2 | S1 | ODT resistor (Ω) |
|---|---|---|---|---|---|
| 0 | 0 | 0 | 0 | 0 | 0 |
| 1 | 0 | 0 | 0 | 1 | 30 |
| 2 | 0 | 0 | 1 | 1 | 40 |
| 3 | 0 | 1 | 1 | 1 | 50 |
| 4 | 1 | 1 | 1 | 1 | 60 |

Referring to Table 1, when the code control signal RC is inputted with a value of "1", the RTT decoder & register 170 decodes the code control signal RC to output the first selection signal S0 as a value of "1" and the second to the fourth selection signals S1 to S3 as values of "0". Accordingly, the first PMOS transistor P1 and the first NMOS transistor N1 among the plurality of transistors provided in the ODT block 230 are turned on. As a result, the impedance of the ODT resistor is set to a value of "30 Ω" according to a division ratio of the first and second resistors R1 and R2.

Accordingly, as shown in FIG. 9, when the code control signal RC for setting a desired impedance of the ODT resistor of DRAM device is changed while the ODT control signal ODT is activated, the impedance of the ODT resistor provided in the output data pad DQ is adjusted in response to the code control signal RC. That is, the impedance of the ODT resistor continuously maintains the same impedance value when the code control signal RC is not changed.

While the preferred embodiment of the present invention has explained that the code control signal RC is changed while the ODT control signal ODT is activated, it is possible that the code control signal RC is changed when a phase of the ODT control signal ODT is changed.

Figure 10:
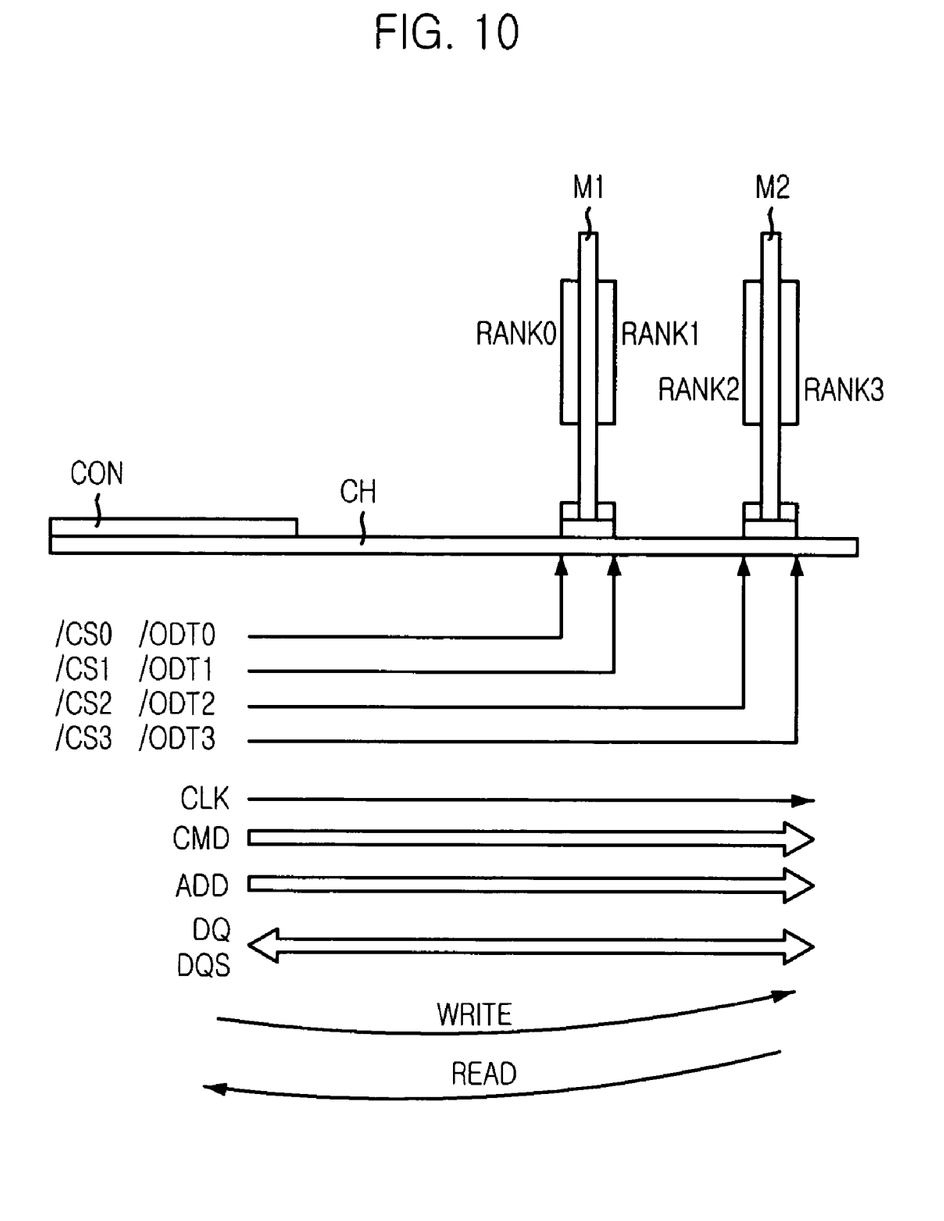
FIG. 10 is a diagram illustrating an operation of a semiconductor memory device in accordance with an embodiment of the present invention.

FIG. 10 is a diagram illustrating an operation of a semiconductor memory device in accordance with an embodiment of the present invention.

As shown, when the number of sockets is two, it is possible to mount first and second memory modules M1 and M2 on a single memory channel CH. At this time, the first and second memory modules M1 and M2 divide the memory channel CH physically.

The first memory module M1 includes first and second ranks RANK0 and RANK1 which are divided physically and logically; the second memory module M2 includes third and fourth ranks RANK2 and RANK3 divided physically and logically. Accordingly, in accordance with this embodiment of the claimed invention, it is possible to maintain an enlargement by mounting the first to fourth ranks RANK0 to RANK3 on the first and second memory modules M1 and M2.

Each of the first to fourth ranks RANK0 to RANK3 denotes a logical memory operation unit and includes a plurality of independent ODT control signals/ODT0 to/ODT3. In addition, each of the first to fourth ranks RANK0 to RANK3 is operated by a plurality of independent chip selection signals/ CS0 to/CS3 for logically dividing the plurality of ranks; and has a different impedance of the ODT resistor during a read and write operation.

In other words, each of the first to fourth ranks RANK0 to RANK3 in the semiconductor memory device selected based on the chip selection signals/CS0 to/CS3 controls the ODT resistor in response to the corresponding ODT control signals/ODT0 to/ODT3. Further, in accordance with this embodiment of the present invention, the code control signal RC is required for selecting one of the ODT resistors.

Therefore, the required signals for selecting and controlling the impedance of the plural ODT resistors are the corresponding ODT control signal, the code control signal RC and the chip selection signal CS.

In addition, the first to fourth ranks RANK0 to RANK3 exclusively share a clock signal CLK, a command signal CMD, an address signal ADD, a channel of the output data pad DQ and the data strobe signal DQS.

When a memory controller CON reads data from a DRAM of the first rank RANK0, the memory controller CON applies the second ODT control signal/ODT1 with a logic level 'HIGH' so as to inactivate a DRAM of the second rank RANK1. During this time, the DRAM of the second rank RANK1 forms the ODT resistor on a data bus shared with the first rank RANK0.

That is, when an arbitrary rank in the memory system composed of the plurality of ranks, i.e., the RANK0 to RANK3, adjusts the impedance of the ODT resistor, each of other ranks may simultaneously adjust its own impedance of the ODT resistor. Herein, in a predetermined rank, an impedance of the ODT resistor during a read operation may be set as a different value from an impedance of the ODT resistor during a writing operation.

Accordingly, because each of the first to fourth ranks RANK0 to RANK3 may adjust a different impedance of the ODT resistor, the impedance of the ODT resistor in view of a data channel may be optimized as various values during data input/output operations.

Herein, a point of altering the impedance of the ODT resistor may be prior to a point of a writing operation of corresponding memory rank, or prior to a point of a read operation of another memory rank. Further, it is possible that the point of altering the impedance of the ODT resistor may be the same as a point of switching from the write operation to the read operation.

As described above, the present invention includes multiple on die termination (ODT) resistors for optimizing channel impedance by allocating an independent ODT resistor to each of a plurality of memory banks or memory modules during read or write operation.

The present application contains subject matter related to Korean patent application Nos. 2005-90935 & 2005-134194, filed in the Korean Patent Office on Sep. 29, 2005 & Dec. 29, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a code channel for outputting a plurality of code signals based on a code control signal;
   a termination resistor decoder for decoding a chip selection signal, an on die termination (ODT) control signal and the plurality of code signals and outputting a plurality of selection signals based on the decoded signals;

an ODT block for providing an output data pad with impedance of a termination resistor which is selected in response to the plurality of selection signals; and a register for saving the plurality of selection signals and the decoded signals of the termination resistor decoder.

2. The semiconductor memory device as recited in claim 1, wherein the ODT block adjusts the impedance of the termination resistor based on a status of the code control signal while the ODT control signal is activated.

3. A semiconductor memory device, comprising:
a code channel for outputting a plurality of code signals based on a code control signal;
a termination resistor decoder for decoding a chip selection signal, an on die termination (ODT) control signal and the plurality of code signals and outputting a plurality of selection signals based on the decoded signals; and
an ODT block for providing an output data pad with impedance of a termination resistor which is selected in response to the plurality of selection signals, wherein the ODT block adjusts the impedance of the termination resistor based on a status of the code control signal when a phase of the ODT control signal is changed.

4. The semiconductor memory device as recited in claim 1, wherein the code channel includes a preset delay time larger than a half clock.

5. The semiconductor memory device as recited in claim 1, wherein the code channel includes:
an amplifying unit for comparing a source voltage with the code control signal to amplify the compared result;
a latch unit for latching an output of the amplifying unit; and
a delaying unit for delaying an output of the latch unit with and without inverting, to output the plurality of code signals.

6. The semiconductor memory device as recited in claim 5, wherein the latch unit includes:
a plurality of switches for selectively outputting the output of the amplifying unit in response to an internal clock; and
a plurality of latches for latching outputs of the plurality of switches.

7. The semiconductor memory device as recited in claim 1, further comprising:
a command input buffer for buffering and outputting the chip selection signal; and
an ODT receiver for buffering and outputting the ODT control signal to the termination resistor decoder.

8. The semiconductor memory device as recited in claim 7, wherein the command input buffer includes:
an amplifying unit for comparing a source voltage with the chip selection signal to amplify the compared result;
a delaying unit for delaying an output of the amplifying unit by a first predetermined time; and
a latch unit for latching an output of the delaying unit by a second predetermined time.

9. The semiconductor memory device as recited in claim 7, wherein the ODT receiver includes:
an amplifying unit for comparing a source voltage with the ODT control signal to amplify the compared result;
a delaying unit for delaying an output of the amplifying unit by a first predetermined time; and
a latch unit for latching an output of the delaying unit by a second predetermined time.

10. The semiconductor memory device as recited in claim 7, wherein the termination resistor decoder includes:

a logical combination unit for logically combining outputs of the command input buffer and the ODT receiver;
a plurality of logic gates for performing a NAND operation of an output of the logical combination unit and the plurality of code signals; and
an inverting unit for inverting outputs of the plurality of logic gates to output the plurality of selection signals.

11. The semiconductor memory device as recited in claim 10, wherein the logical combination unit includes:
a first inverter for inverting the output of the command input buffer;
a logic gate for performing a NAND operation of outputs of the first inverter and the ODT receiver; and
a second inverter for inverting an output of the logic gate.

12. The semiconductor memory device as recited in claim 1, wherein the ODT block includes:
a plurality of PMOS transistors having one terminal connected with a source voltage terminal and gates for receiving a plurality of inverted selection signals;
a plurality of NMOS transistors having one terminal connected with a ground voltage terminal and gates for receiving the plurality of selection signals; and
a plurality of resistors connected between the plurality of PMOS transistors and the plurality of NMOS transistors.

13. The semiconductor memory device as recited in claim 1, further comprising an input/output register connected between the output data pad and a memory cell,
wherein the input/output register includes:
a first receiver for comparing a signal applied from the output data pad with a reference voltage and outputting the compared signal to the memory cell; and
a second receiver for buffering and outputting a signal applied from the memory cell to the output data pad.

14. The semiconductor memory device as recited in claim 1 wherein said code control signal is input from an external source.

15. A semiconductor memory device, comprising:
a plurality of memory banks for controlling a read/write operation of data in memory cells;
a code channel for outputting a plurality of code signals based on a code control signal;
a command input buffer for buffering a chip selection signal and outputting a buffered signal;
an on-die termination (ODT) receiver for receiving an ODT control signal and outputting a received signal;
a termination resistor decoder for decoding the buffered signal from the command input buffer, the received signal from the ODT receiver and the plurality of code signals and outputting a plurality of selection signals based on the decoded signals; and
an ODT block for providing an output data pad with impedance of a termination resistor which is selected in response to the plurality of selection signals.

16. The semiconductor memory device as recited in claim 15, further comprising a register for saving the plurality of selection signals and the decoded signals of the termination resistor decoder.

17. The semiconductor memory device as recited in claim 15, wherein the ODT block adjusts the impedance of the termination resistor before starting the write operation of the plurality of memory banks.

18. The semiconductor memory device as recited in claim 15, wherein the ODT block adjusts the impedance of the termination resistor during the read/write operation of the plurality of memory banks.

19. The semiconductor memory device as recited in claim 15, wherein the impedance of the termination resistor is adjusted during the read and write operations.

20. The semiconductor memory device as recited in claim 15 wherein said code control signal is input from an external source.

21. A semiconductor memory device, comprising:
a plurality of memory modules connected to a data channel; and
a plurality of ranks connected to the plurality of memory modules and having one of a logical memory operation unit and a physical memory operation unit,
wherein the plurality of ranks include a termination resistor control unit for allocating a different impedance of a termination resistor to the plurality of ranks during read and write operations of the plurality of memory modules, according to a combination of a chip selection signal, an on die termination (ODT) control signal and a code control signal, and
wherein the impedance of the termination resistor is adjusted based on a status of the code control signal when a phase of the ODT control signal is changed.

22. The semiconductor memory device as recited in claim 21, wherein each rank controls the impedance of the termination resistor in response to the ODT control signal and the chip selection signal which is independently controlled.

23. The semiconductor memory device as recited in claim 21, wherein the plurality of ranks exclusively share the data channel.

24. The semiconductor memory device as recited in claim 23, wherein one of the plurality of ranks is selected based on the chip selection signal.

25. The semiconductor memory device as recited in claim 21, wherein each of the plurality of ranks has a different impedance of the termination resistor during the read and write operations.

26. The semiconductor memory device as recited in claim 21, wherein the impedance of the termination resistor of a certain rank among the plurality of ranks is changed before starting the read operation of the other ranks.

27. The semiconductor memory device as recited in claim 21, wherein the plurality of ranks have the impedance of the termination resistor which is changed prior to switching from the write operation to the read operation.

* * * * *